United States Patent
Wagner et al.

[11] Patent Number: 5,410,592
[45] Date of Patent: Apr. 25, 1995

[54] CLASS 'D' AUDIO SPEAKER AMPLIFIER CIRCUIT WITH STATE VARIABLE FEEDBACK CONTROL

[75] Inventors: Randall M. Wagner, Thousand Oaks; Yogi L. Mistry, Simi Valley, both of Calif.

[73] Assignee: Harris Corporation, Melbourne, Fla.

[21] Appl. No.: 73,204

[22] Filed: Jun. 4, 1993

[51] Int. Cl.⁶ .............................................. H04M 9/10
[52] U.S. Cl. ..................................... 379/388; 379/389; 330/251; 330/253
[58] Field of Search ................. 379/388, 389; 330/251, 330/253, 24, 228; 381/110

[56] References Cited

U.S. PATENT DOCUMENTS

| | | | |
|---|---|---|---|
| 4,178,556 | 12/1979 | Attwood | 330/10 |
| 4,720,848 | 1/1988 | Akiyama | 379/217 |
| 4,885,577 | 12/1989 | Nelson | 340/825.44 |
| 5,063,332 | 11/1991 | El-Hamamsy et al. | 330/207 |
| 5,160,896 | 11/1992 | McCorkle | 330/251 |
| 5,200,711 | 4/1993 | Andersson et al. | 330/267 |

Primary Examiner—James L. Dwyer
Assistant Examiner—Jacques M. Saint-Surin
Attorney, Agent, or Firm—Charles E. Wands

[57] ABSTRACT

An audio amplifier for providing a power boost for telephone-sourced audio signals that drive one or more paging speakers employs a class D amplifier and a state variable feedback network, which monitors voltage and current levels of an audio output filter to which the paging speakers are coupled, so as to adjust the operation of the amplifier circuit, as necessary, to compensate variations in the speaker loading of the audio output filter. The class D amplifier includes a pulse width modulator, which controls the switching of a power H-bridge-configured switching circuit. The switching circuit sources and sinks current with respect to the paging speaker load. The output of the power bridge switching circuit is a high energy square wave-type signal, which is filtered in a downstream audio filter to remove the switching transients and preserve the desired voice paging signal for application to the paging speakers. The state variable feedback network monitors variations in current flow and voltage at a plurality of circuit locations of the audio filter circuit and sums the monitored variations to produce an error signal, which is fed back to the input of the voice paging amplifier circuit and combined with the audio input signal.

24 Claims, 3 Drawing Sheets

CLASS 'D' AUDIO SPEAKER AMPLIFIER CIRCUIT WITH STATE VARIABLE FEEDBACK CONTROL

FIELD OF THE INVENTION

The present invention relates in general to communication (e.g. telephone) circuits, and is particularly directed to an improved audio amplifier (such as that employed in the signal flow path of a telephone-sourced voice paging system) which employs a class D amplifier, the low-pass (audio) filtered output of which is monitored via a state variable feedback network to adjust the content of the audio input signal and thereby the operation of the class D amplifier for variations in load (output speaker).

BACKGROUND OF THE INVENTION

Telephone paging systems typically employ one or more paging speakers (driven by an attendant speaker amplifier) that are distributed throughout the respective paging zones served by the system. Because the audio (paging voice) signals are sourced from telephone signalling components, e.g. a desktop console or handset, the signals are of relatively low energy content and therefore require substantial amplification in order to successfully drive one or more paging speakers served by the system to a dB level that will be audible to paged personnel. The required power boost of telephone-sourced paging signals has been conventionally accomplished using a (relatively inefficient) class A speaker amplifier in the signal flow path from the telephone equipment sourcing the audio signals and one or more paging speakers.

Unfortunately, due to its relatively low efficiency, the audio class A amplifier dissipates a substantial amount of $I^2R$ power as heat. As a consequence, the amplifier must be fabricated using large components and be connected to a relatively massive heat sink, which adds to the size and cost of the paging speaker components. Now, although another class of (audio) amplifier, such as a class D amplifier, may be more efficient, the performance of its associated audio output filter (to which one or more paging speakers are coupled as the output load) is highly dependent upon the output load. Therefore, for a given load the parameters of the (inductive and capacitive) components of the filter are tailored to optimize filter performance (maintain a flat frequency response). Unfortunately, in any given paging speaker installation, the number and size of paging speakers to be driven by the speaker amplifier may vary, so that setting the parameters of the class D amplifier output filter to a prescribed load specification may prove inadequate and distort the audio signals supplied to a speaker configuration different than for which the filter was originally designed. Thus, the inefficient class A paging amplifier circuit has continued to be used as the accepted paging speaker amplifier configuration.

SUMMARY OF THE INVENTION

In accordance with the present invention, the cost and hardware penalty associated with the use of a class A amplifier for providing a power boost for telephone-sourced audio signals, that drive a variable load output (one or more paging speakers), is effectively obviated by replacing the class A amplifier with a more efficient class D amplifier and adjusting the operation of the amplifier circuit, as necessary, to compensate variations in the loading of the audio output filter, by means of a state variable feedback network, which monitors voltage and current levels of the audio output filter to which the paging speaker (load) is coupled. The effect of the adjustment is to keep the frequency response of the audio filter substantially flat regardless of the load (e.g. number and size of paging speakers).

More particularly, the voice paging amplifier circuit in accordance with the invention comprises a class D amplifier, implemented using a pulse width modulator (PWM), having an audio input port to which a voice-paging audio signal to be amplified is applied. A power H-bridge-configured switching circuit, which is operative to source and sink current with respect to the output audio circuit (paging speaker), contains power FETs which are driven (gated on and off) by the output of the class D (pulse width modulation) amplifier, so as to effect pulse duration modulation of a pair of complementary power supply voltages for driving the paging speaker at the required amplification level.

The output of the PWM-driven power bridge switching circuit is a high energy square wave-type signal, which is filtered in a downstream audio filter (configured as an inductive - capacitive network) to remove the switching transients and preserve the desired audio (voice paging signal) for application to one or more paging speakers (which constitute the load for the filter). A state variable feedback network monitors variations in current flow and voltage at a plurality of circuit locations of the audio filter circuit and sums the monitored variations to produce an error signal. This error signal is fed back to the input of the voice paging amplifier circuit and combined with the audio input signal, to form a resultant audio drive signal that is applied to the class D amplifier. Because the characteristics of the LC audio filter are greatly affected by the load (one or more speakers of the voice paging system), using state variable feedback allows the class D amplifier circuit to attain stability and provide the necessary drive characteristic to the audio filter, so that its frequency response remains generally flat.

DETAILED DESCRIPTION

Figure 1:
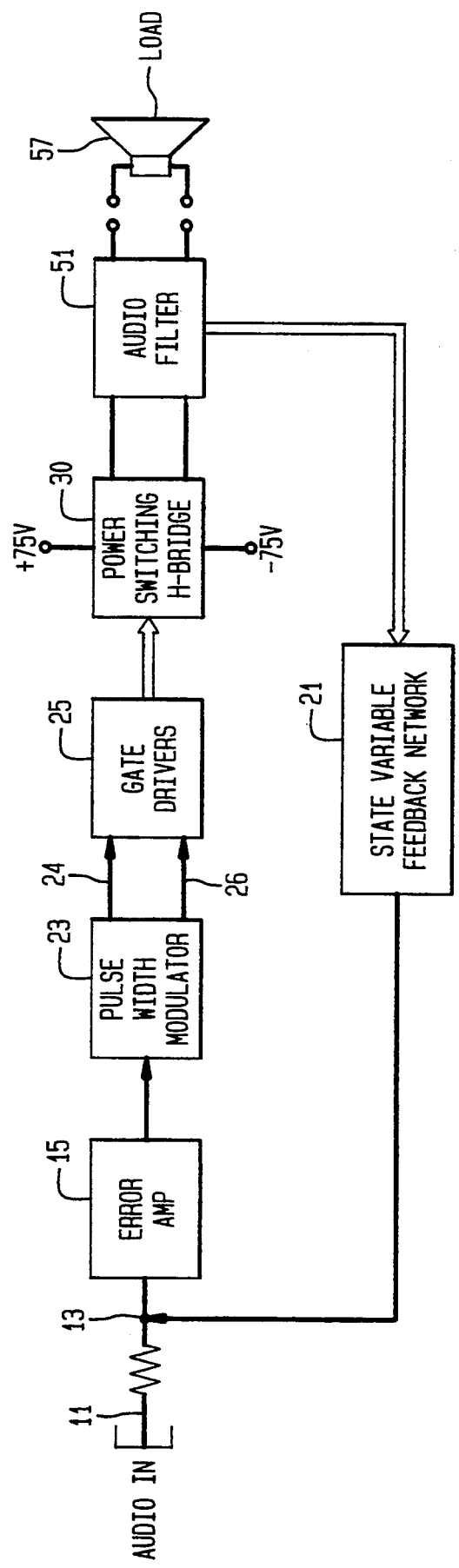
FIG. 1 is a diagrammatic illustration of state variable feedback-controlled class D audio amplifier circuit in accordance with an embodiment of the invention.
Figure 2:
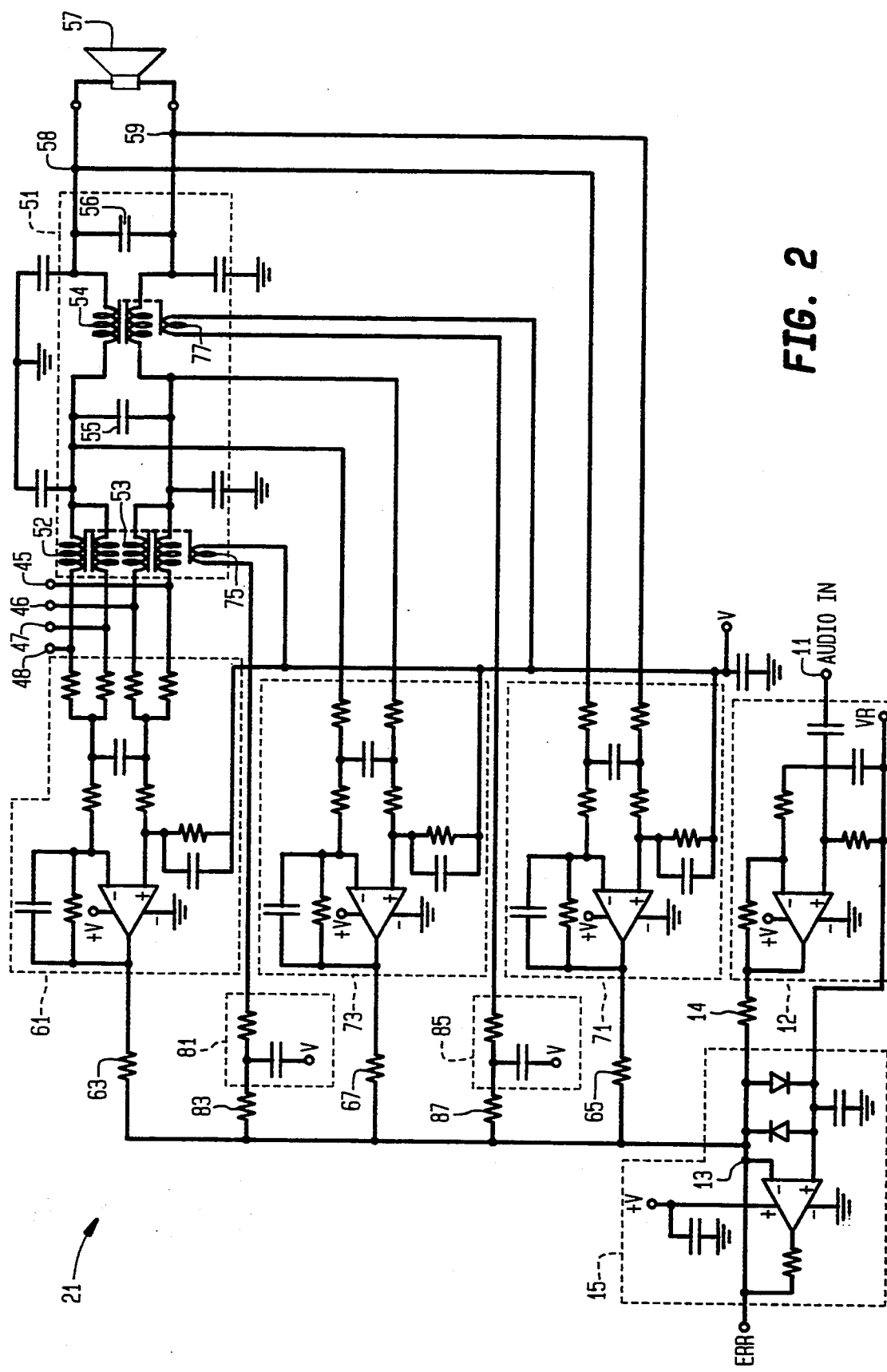
FIGS. 2 and 3 are schematic circuit diagrams of an implementation of the audio amplifier circuit of FIG. 1.
Figure 3:
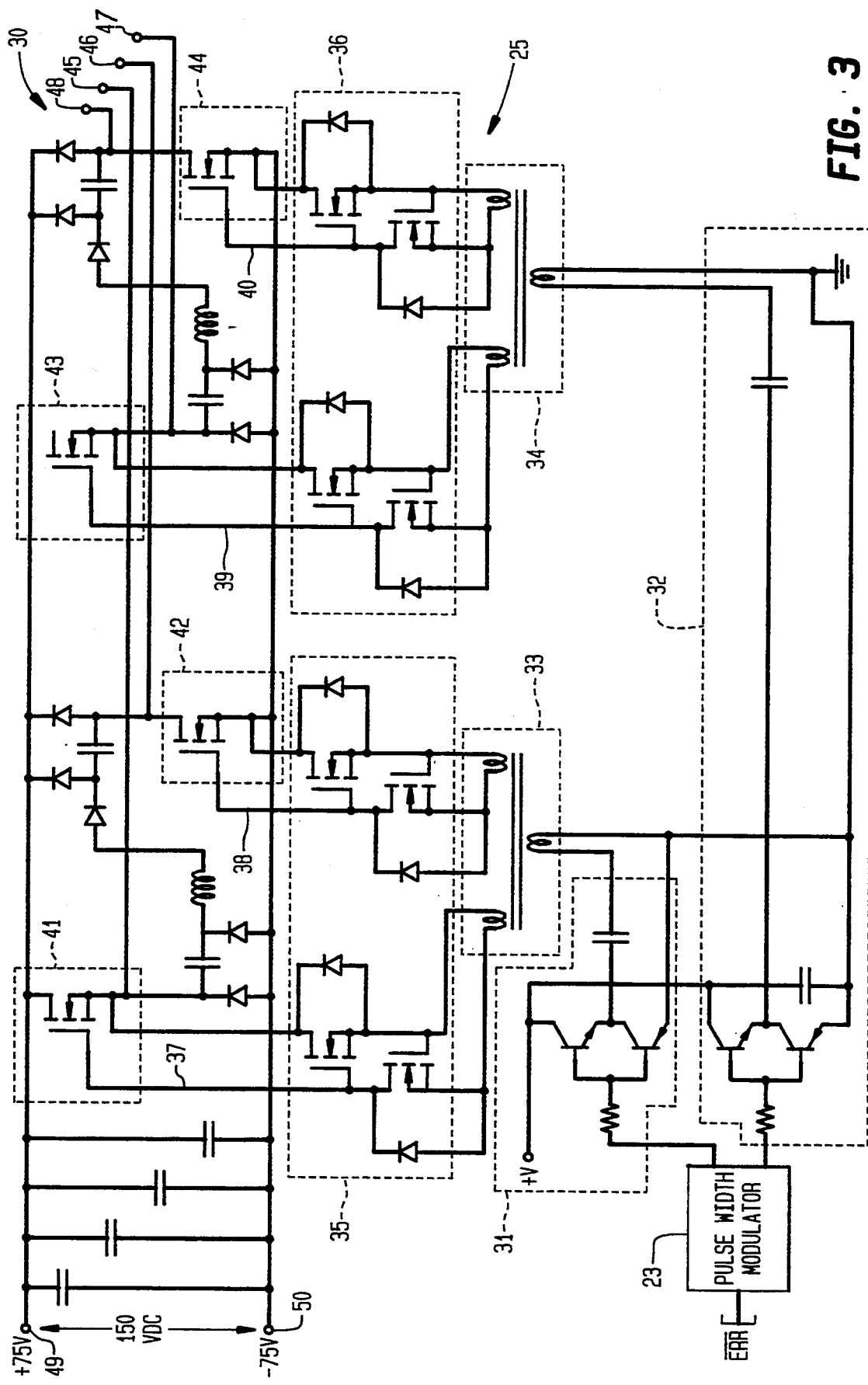

FIG. 1 diagrammatically illustrates a state variable feedback-controlled class D audio amplifier circuit in accordance with an embodiment of the invention, while FIGS. 2 and 3 are schematic diagrams showing the details of the respective components of which the amplifier circuit of FIG. 1 is configured. As pointed out above, the present invention has particular utility in a telephone voice paging amplifier system, where the output (paging speaker) load can be expected to vary from installation to installation. One example of a telephone voice paging system where the present invention may be used is described in co-pending application Ser. No. 08/073,200, filed on even date herewith, entitled "Phone Keypad-Sourced Volume Control for Paging System," by R. Soto et al, assigned to the assignee of the present application and the disclosure of which is herein incorporated.

Referring now to FIGS. 1–3, the inventive state variable feedback-controlled class D audio amplifier circuit is shown as comprising an input port 11 to which an audio signal to be amplified is applied. In the present description the phrases 'audio signal' or 'voice paging signal' are used in the ordinary sense, being understood to encompass audio band frequencies (on the order of 20 Hz–20 KHz). Input port 11 is coupled (via a scaling amplifier 12 and input resistor 14, FIG. 2) to a summing node 13 of an error amplifier 15, to which the output of a state variable feedback network 21, to be described, is connected. The combined voltage at summing node 13 is amplified by error amplifier 15 and the resultant signal (ERR BAR, FIG. 2) is coupled to a pulse width modulator circuit 23 (also shown in the schematic of FIG. 3). Pulse width modulator circuit 23 may employ a DC motor controller chip UC3637N, manufactured by Unitrode Corp., which outputs a periodic pulse waveform on respective output links 24, 26, having a duty cycle proportional to the resultant audio input signal ERR BAR from error amplifier 15.

The pulse width-modulated output signal produced by pulse width modulator 23 is applied via links 24, 26 to a gate drive circuit 25 for controlling the (switching) operation of a power H-bridge-configured switching (modulation) circuit 30. As shown in detail in FIG. 3, gate drive circuit 25 comprises first and second pairs of push-pull bipolar transistor drive circuits 31, 32, the base drives for which are coupled to links 24, 26 and outputs of which are transformer coupled, at 33, 34, to respective pairs of FET drive transistor circuits 35, 36, having respective pairs of complementary output drive links 7, 38 and 39, 40.

The complementary output drive links 37, 38 and 39, 40 of gate drive circuit 25 are coupled to respective drive (gating) inputs of respective pairs of power FET switching transistor circuits 41, 42 and 43, 44 that form respective arms of a power switching circuit 30. Because the output load of the amplifier circuit is an AC load, power switching circuit 30 is operative to both source and sink current with respect to the output audio circuit (transformer-coupled paging speaker). For this purpose, as shown in detail in FIG. 3, the power FET circuits 41, 42, 43, and 44 are operative to controllably switch, to respective pairs of output terminals 45, 46, 46, 48, relatively large magnitude ,opposite polarity voltages (e.g. on the order of ±75 volts for driving the paging speaker at a prescribed amplification level), provided at complementary power supply terminals 49, 50.

The switched output of PWM-driven power bridge circuit 30 is a high energy square wave-type signal, which is filtered in a downstream audio filter circuit 51. Audio filter circuit 51 is configured as an inductive-capacitive (LC) network, shown in detail in FIG. 2 as comprising respective pairs of inductor windings 52, 53 wound on the same common core and a second pair of inductor windings 54, respective ones of which are wound on a common core and coupled in series with windings 52 and 53. Completing the filter are capacitors 55 and 56 which bridge the input and output terminals of inductor winding pair 54. (The additional capacitors provide high frequency noise rejection to ground.) Audio filter circuit 51 is operative to filter the square wave output drive signal of bridge circuit 30, so as to preserve the desired audio signal, while filtering out switching transients, and thereby drive the AC paging speaker output load 57 with the only the desired audio paging signal.

As pointed out above, state variable feedback network 21 is coupled to monitor variations in current flow through the inductor components and voltages across capacitor components and input and output terminals of the audio filter circuit 51 and sums the monitored variations to produce an error signal. For this purpose, as shown in detail in FIG. 2, filter input terminals 45, 46, 47, 48 are coupled in respective pairs to respective differential input ports of differential amplifier 61, the output of which is coupled through a summing resistor 63 to summing node 13.

Similarly, filter output terminals 58, 59 (the voltage across capacitor 56) are coupled to the respective differential input ports of differential amplifier 71, the output of which is coupled through a summing resistor 65 to summing node 13. Also the voltage across capacitor 55 is coupled to the differential input ports of differential amplifier 73, the output of which is coupled through a summing resistor 67 to summing node 13.

To monitor the currents flowing through filter inductors 52, 53, an additional inductor winding 75 is co-wound on the same core with inductors 52, 53 and its output voltage is coupled to an integrator 81. The output of integrator 81 is representative of the current through inductors 52, 53, which is applied through summing resistor 83 to summing node 13. To monitor the current flowing through filter inductor 54, an additional inductor winding 77 is co-wound on the same core with inductor 54 and its output voltage is coupled to an integrator 85.

The output of integrator 85 is representative of the current through inductor 54, which is applied through summing resistor 87 to summing node 13. Thus, the resultant signal at summing node 13 is a combination of state variables of the audio filter plus the audio input signal supplied to audio input port 11. This resultant audio drive signal is output by error amplifier 15 for driving pulse width modulator 23.

As noted above, the characteristics of the LC audio filter 51 will vary with the load (one or more speakers 57 of the voice paging system) to which output of the audio filter 51 is coupled. By monitoring parameters of the audio filter, the state variable feedback network 21 allows the class D audio paging amplifier circuit of FIGS. 1–3 to attain stability and provide the necessary drive characteristic to the audio filter, so that the frequency response of the filter remains generally flat.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. An audio amplifier circuit comprising:
    a class D amplifier having an audio input port to which an audio input signal to be amplified is applied;
    a power amplifying switching circuit coupled in circuit with the output of said class D amplifier and prescribed power supply terminals, and being operative to generate a power amplified audio drive signal for application to an audio output load port in accordance with the output of said class D amplifier;

an audio filter circuit coupled between said power amplifying switching circuit and said load port and being operative to filter the output drive signal of said power amplifying switching circuit; and a state variable feedback network coupled to monitor variations in current flow and voltage at a plurality of circuit locations of said audio filter circuit and to produce therefrom an error signal to be combined with said audio input signal.

2. An audio amplifier circuit according to claim 1, wherein said load port is coupled to a voice paging speaker, and wherein said audio input signal is a voice paging signal.

3. An audio amplifier circuit according to claim 1, wherein said class D amplifier comprises a pulse width modulator circuit.

4. An audio amplifier circuit according to claim 3, wherein said power amplifying switching circuit comprises a power bridge circuit, having first and second input terminals to which complementary versions of the output of said pulse width modulator circuit are applied, complementary polarity voltage terminals to which complementary polarity voltages are coupled, and a controlled switching circuit arranged in respective arms of said power bridge circuit and having power input terminals coupled to said complementary polarity voltage terminals, power output terminals coupled to said audio filter circuit, and control terminals that are driven in accordance with the complementary versions of the output of said pulse width modulator circuit applied to said first and second input terminals.

5. An audio amplifier circuit according to claim 4, wherein said bridge circuit further comprises first and second bridge driver circuits coupled to drive the first and second input terminals of said power bridge circuit in accordance with the output of said pulse width modulator circuit.

6. An audio amplifier circuit according to claim 5, wherein said load port is coupled to a voice paging speaker, and wherein said audio input signal is a voice paging signal.

7. An audio amplifier circuit according to claim 1, wherein said audio filter circuit comprises an inductor-capacitor filter network, and wherein said state variable feedback network is coupled to monitor variations in current flow through inductor components of said inductor-capacitor network and voltage variations across capacitor components of said inductor-capacitor network and produces therefrom an error signal to be combined with said audio input signal.

8. An audio amplifier circuit according to claim 7, wherein said class D amplifier includes an error amplifier circuit coupled to receive said error signal and said audio input signal, the output of said error amplifier being coupled to said pulse width modulator.

9. An audio amplifier circuit for a voice paging speaker system that provides telephone-sourced voice paging comprising:

an input port which is coupled to receive a telephone-sourced voice paging signal;

a summing amplifier having a summing port coupled to receive said telephone-sourced voice paging signal, said summing amplifier producing a resultant audio input signal;

a class amplifier to which the resultant audio input signal produced by said summing amplifier is coupled;

a power amplifying switching circuit coupled to the output of said class D amplifier and prescribed power supply terminals, and being operative to generate a power amplified audio drive signal for application to a paging speaker output port in accordance with the output of said class D amplifier;

an audio filter circuit coupled between said power amplifying switching circuit and said paging speaker output port and being operative to filter the output drive signal of said power amplifying switching circuit; and a state variable feedback network coupled to monitor variations in current flow and voltage at a plurality of circuit locations of said audio filter circuit and to produce therefrom respective variation signals, which are coupled to the summing port of said summing amplifier so as to be combined with said telephone-sourced voice paging signal to produce said resultant audio input signal.

10. An audio amplifier circuit according to claim 9, wherein said class D amplifier comprises a pulse width modulator circuit.

11. An audio amplifier circuit according to claim 10, wherein said power amplifying switching circuit comprises a power bridge circuit, having first and second input terminals to which complementary versions of the output of said pulse width modulator circuit are applied, complementary polarity voltage terminals to which complementary polarity voltages are coupled, and a controlled switching circuit arranged in respective arms of said power bridge circuit and having power input terminals coupled to said complementary polarity voltage terminals, power output terminals coupled to said audio filter circuit, and control terminals that are driven in accordance with the complementary versions of the output of said pulse width modulator circuit applied to said first and second input terminals.

12. An audio amplifier circuit according to claim 11, wherein said bridge circuit further comprises first and second bridge driver circuits coupled to drive the first and second input terminals of said power bridge circuit in accordance with the output of said pulse width modulator circuit.

13. An audio amplifier circuit according to claim 12, wherein said audio filter circuit comprises an inductor-capacitor filter network, and wherein said state variable feedback network is coupled to monitor variations in current flow through inductor components of said inductor-capacitor network and voltage variations across capacitor components of said inductor-capacitor network and produces therefrom said respective variation signals.

14. For use with a voice paging speaker system that provides telephone-sourced voice paging to a paging area via one or more paging speakers, a method of amplifying a telephone-source voice paging signal for application to said one or more voice paging speakers comprising the steps of:

(a) applying said telephone-sourced voice paging signal to a signal combining circuit, which produces a resultant audio input signal;

(b) coupling said resultant audio signal to a class D amplifier;

(c) coupling the output of said class D amplifier to a power amplifying switching circuit, said power amplifying switching circuit being coupled to prescribed power supply terminals, and being operative to generate a power amplified audio drive signal for application to a paging speaker output port in accordance with the output of said class D amplifier;

(d) filtering said power amplified audio drive signal by way of an audio filter circuit and coupling the filtered audio signal to said paging speaker output port; and (e) monitoring variations in current flow and voltage at a plurality of circuit locations of said audio filter circuit so as to produce therefrom respective variation signals, and combining, by way of said signal combining circuit, said variation signals with said telephone-sourced voice paging signal, to produce said resultant audio input signal.

15. A method according to claim 14, wherein said class D amplifier comprises a pulse width modulator circuit.

16. A method according to claim 15, wherein said power amplifying switching circuit comprises a power bridge circuit, having first and second input terminals to which complementary versions of the output of said pulse width modulator circuit are applied, complementary polarity voltage terminals to which complementary polarity voltages are coupled, and a controlled switching circuit arranged in respective arms of said power bridge circuit and having power input terminals coupled to said complementary polarity voltage terminals, power output terminals coupled to said audio filter circuit, and control terminals that are driven in accordance with the complementary versions of the output of said pulse width modulator circuit applied to said first and second input terminals.

17. A method according to claim 16, wherein said bridge circuit further comprises first and second bridge driver circuits coupled to drive the first and second input terminals of said power bridge circuit in accordance with the output of said pulse width modulator circuit.

18. A method according to claim 17, wherein said audio filter circuit comprises an inductor-capacitor filter network, and wherein said state variable feedback network is coupled to monitor variations in current flow through inductor components of said inductor-capacitor network and voltage variations across capacitor components of said inductor-capacitor network and produces therefrom said respective variation signals.

19. An audio amplifier circuit according to claim 1, wherein said audio filter circuit includes a differential signal flow path pair and comprises an inductor-capacitor filter network having inductor components through which current, flowing through said differential signal flow path pair, flows between said power amplifying switching circuit and said audio output load port, and capacitor components coupled across said differential signal flow path pair, and wherein said state variable feedback network is coupled to said inductor components and monitors variations in current flow through said inductor components, and is coupled to said capacitor components and monitors variations in voltage across said capacitor components, and produces an error signal which is combined with said audio input signal applied to said audio input port.

20. An audio amplifier circuit according to claim 19, wherein said state variable feedback network further includes a differential amplifier circuit having differential inputs thereof coupled to said differential signal flow path pair, and an output which is summed with monitored current flow variations through said inductor components and voltage variations across said capacitor components to produce said error signal.

21. An audio amplifier circuit according to claim 9, wherein said audio filter circuit includes a differential signal flow path pair and comprises an inductor-capacitor filter network having inductor components through which current, flowing through said differential signal flow path pair, flows between said power amplifying switching circuit and said paging speaker output port, and capacitor components coupled across said differential signal flow path pair, and wherein said state variable feedback network is coupled to said inductor components and monitors variations in current flow through said inductor components, and is coupled to said capacitor components and monitors variations in voltage across said capacitor components, and produces an error signal which is applied to said summing port.

22. An audio amplifier circuit according to claim 21, wherein said state variable feedback network further includes a differential amplifier circuit having differential inputs thereof coupled to said differential signal flow path pair, and an output which is summed with monitored current flow variations through said inductor components and voltage variations across said capacitor components to produce said error signal.

23. A method circuit according to claim 14, wherein step (d) comprises filtering said power amplified audio drive signal through an audio filter circuit having a differential signal flow path pair, said audio filter circuit comprising an inductor-capacitor filter network having inductor components through which current flowing through said differential signal flow path pair flows between said power amplifying switching circuit and said paging speaker output port, and capacitor components coupled across said differential signal flow path pair, and wherein step (e) comprises coupling a state variable feedback network to said inductor components and said capacitor components, said state variable feedback network monitoring variations in current flow through said inductor components, and variations in voltage across said capacitor components, and producing an error signal which is combined with said telephone-sourced voice paging signal to produce said resultant audio input signal.

24. A method according to claim 23, wherein said state variable feedback network further includes a differential amplifier circuit having differential inputs thereof coupled to said differential signal flow path pair, and an output which is summed with monitored current flow variations through said inductor components and voltage variations across said capacitor components to produce said error signal.

* * * * *